(12) United States Patent
Zimmermann

(10) Patent No.: US 9,704,764 B2
(45) Date of Patent: Jul. 11, 2017

(54) ELECTRONIC DEVICES INCLUDING ORGANIC MATERIALS

(71) Applicant: FLEXENABLE LIMITED, Cambridge (GB)

(72) Inventor: Bernd Zimmermann, Dresden (DE)

(73) Assignee: FLEXENABLE LIMITED, Cambridge (GB)

( * ) Notice: Subject to any disclaimer, the term of this patent is extended or adjusted under 35 U.S.C. 154(b) by 0 days.

(21) Appl. No.: 15/026,145

(22) PCT Filed: Oct. 7, 2014

(86) PCT No.: PCT/EP2014/071467
§ 371 (c)(1),
(2) Date: Mar. 30, 2016

(87) PCT Pub. No.: WO2015/052200
PCT Pub. Date: Apr. 16, 2015

(65) Prior Publication Data
US 2016/0247732 A1    Aug. 25, 2016

(30) Foreign Application Priority Data

Oct. 8, 2013   (GB) .................................. 1317760.5

(51) Int. Cl.
*H01L 21/00* (2006.01)
*H01L 21/66* (2006.01)
(Continued)

(52) U.S. Cl.
CPC ........ *H01L 22/14* (2013.01); *H01L 21/76895* (2013.01); *H01L 21/823462* (2013.01); *H01L 21/823481* (2013.01); *H01L 22/20* (2013.01); *H01L 27/283* (2013.01); *H01L 29/66477* (2013.01); *H01L 51/0558* (2013.01); *H01L 27/124* (2013.01); *H01L 27/1248* (2013.01);
(Continued)

(58) Field of Classification Search
CPC . H01L 21/707; H01L 21/76895; H01L 21/82; G02F 1/136204
See application file for complete search history.

(56) References Cited

U.S. PATENT DOCUMENTS

| | | | |
|---|---|---|---|
| 2006/0023154 A1 | 2/2006 | Harada et al. | |
| 2008/0266514 A1* | 10/2008 | Moriya | G02F 1/136204 349/187 |
| 2011/0014736 A1* | 1/2011 | Kim | H01L 27/307 438/34 |

FOREIGN PATENT DOCUMENTS

| | | |
|---|---|---|
| DE | 102007062944 A1 | 6/2009 |
| GB | 2480875 A | 12/2011 |

OTHER PUBLICATIONS

International Search Report of PCT/EP2014/071467 dated Feb. 27, 2015.

* cited by examiner

*Primary Examiner* — Zandra Smith
*Assistant Examiner* — Evan Clinton
(74) *Attorney, Agent, or Firm* — Sughrue Mion, PLLC

(57) ABSTRACT

A method comprising forming on a common support (6) one or more series of multi-layer electronic devices (covering the areas 2a, 2b respectively), and then separating the electronic devices; wherein the devices comprise one or more organic layers (9), and the method comprises depositing one or more of the organic layers (9) as a respective continuous layer extending at least from one end of the one or more series of devices to an opposite end of the one or more series of devices.

10 Claims, 2 Drawing Sheets

Figure 1:
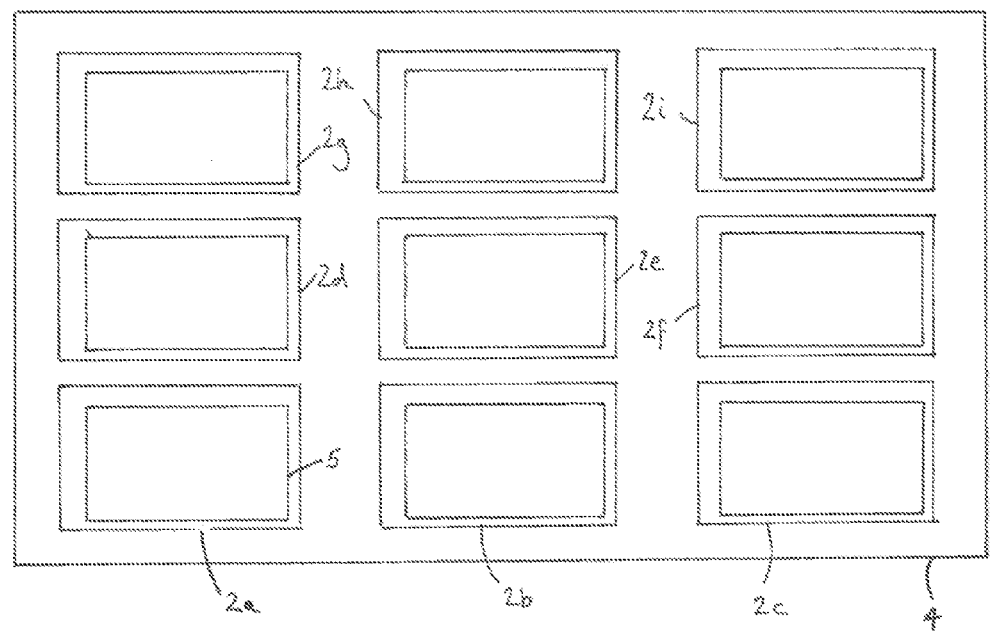

(51) Int. Cl.
*H01L 27/28* (2006.01)
*H01L 21/768* (2006.01)
*H01L 21/8234* (2006.01)
*H01L 29/66* (2006.01)
*H01L 51/05* (2006.01)
*H01L 27/32* (2006.01)
*H01L 27/12* (2006.01)

(52) U.S. Cl.
CPC ...... *H01L 27/3262* (2013.01); *H01L 27/3276* (2013.01); *H01L 2251/566* (2013.01)

ELECTRONIC DEVICES INCLUDING ORGANIC MATERIALS

CROSS REFERENCE TO RELATED APPLICATIONS

This application is a National Stage of International Application No. PCT/EP2014/071467 filed Oct. 7, 2014 claiming priority based on British Patent Application No. 1317760.5, filed Oct. 8, 2013, the contents of which are incorporated herein by reference in their entirety.

Organic materials are increasingly being used for electronically functional elements in electronic devices. For example, organic materials are increasingly being used for semiconductor and insulator/dielectric elements of transistor arrays.

One technique for producing an electronic device including organic materials comprises depositing organic materials over a support substrate, and using a masking process to avoid the deposition of organic materials in one or more locations within the area of the part of the support substrate to remain in the final device, to leave areas free of organic material at one or more peripheral areas of the device.

The inventors for the present application have observed defects in devices produced by such technique, and have identified the challenge of further reducing the occurrence of defects.

It is an aim of the present invention to further reduce the occurrence of defects in devices including organic materials.

There is hereby provided a method comprising forming on a common support one or more series of multi-layer electronic devices, and then separating the electronic devices; wherein the devices comprise one or more organic layers, and the method comprises depositing one or more of the organic layers as a respective continuous layer extending at least from one end of the one or more series of devices to an opposite end of the one or more series of devices.

According to one embodiment, the electronic devices each comprise an array of transistors, and the one or more organic layers deposited as continuous layers comprise one or more of: a semiconductor layer defining the semiconductor channels of the transistors; a dielectric layer defining the gate dielectric of the transistors, and one or more insulator layers between conductor layers.

According to one embodiment, the electronic devices comprise at least one conductor layer defining an array of conductors to be driven via respective output terminals of one or more driver chips; and the method comprises locating contacts for said one or more driver chips over said one or more organic layers deposited as continuous layers, which contacts are connected to respective ones of said conductors through said one or more organic layers deposited as continuous layers.

According to one embodiment, the devices comprise at least three conductor layers at respective levels, and wherein the method further comprises compressing a peripheral region of said one or more or organic layers deposited as continuous layers; and creating one or more conductive connections between one or more parts of an upper conductor layer in said peripheral region and one or more parts of an intermediate conductor layer inwards of said peripheral region via one or more parts of a lower conductor layer extending between said peripheral region and said region inwards of said peripheral region.

According to one embodiment, said upper conductor layer defines gate and source contacts for an array of transistors, and said one or more parts of said intermediate conductor comprise one or more gate conductors providing gate electrodes for said array of transistors and/or one or more source conductors providing source electrodes for said array of transistors.

According to one embodiment, the method further comprises providing at least one shorting conductors linking a group of conductors within a conductor layer provided under one or more of said one or more organic layers deposited as continuous layers; providing at least one interlayer conductive connection between said shorting conductor through said one or more organic layers to a contact provided over said one or more organic layers deposited as continuous layers; performing electrical testing via said contact; and later isolating said shorting conductor from said group of conductors by removing one or more portions of said conductor layer and one or more portions of said one or more organic layers overlying said one or more portions of said conductor layer.

Figure 2:
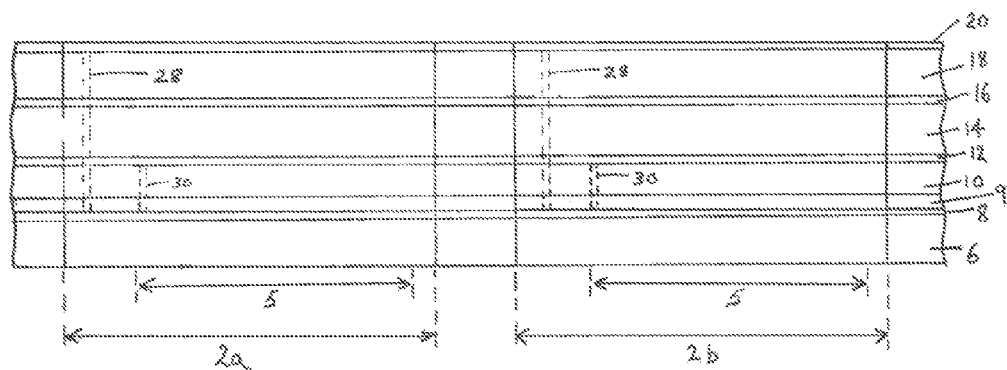
Figure 3:
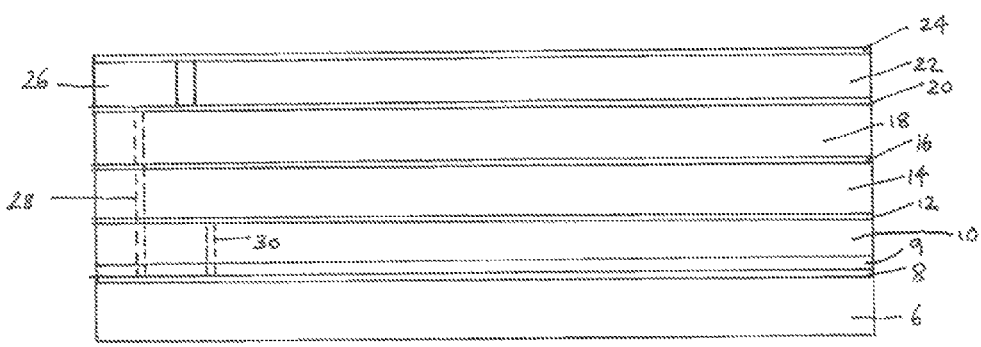
Figure 4:
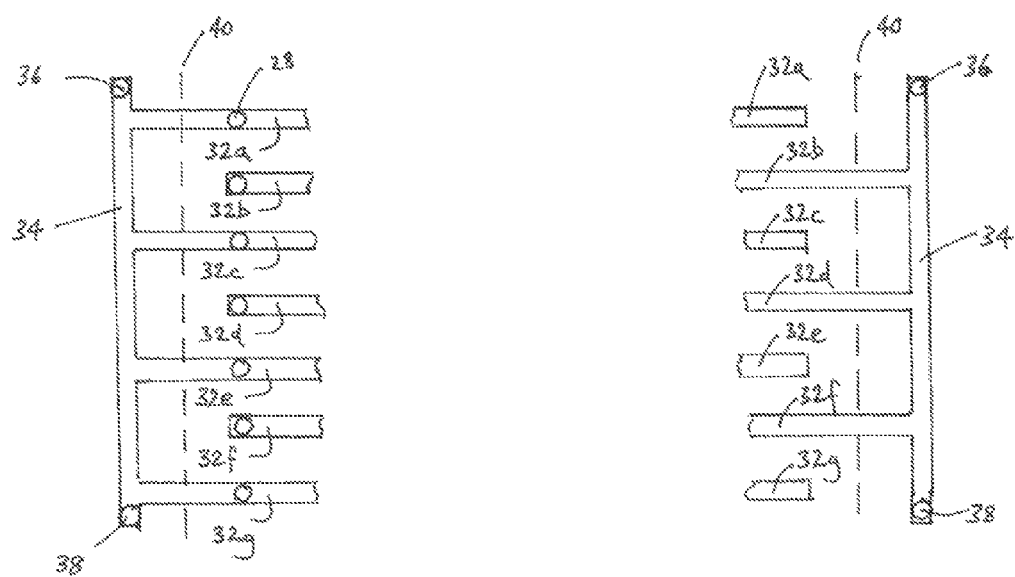

An example of a technique according to an embodiment of the invention is described hereunder, by way of example only, with reference to the accompanying drawings, in which:

FIG. 1 schematically illustrates an example of the area of deposition of layers forming a plurality of electronic devices including organic materials;

FIG. 2 schematically illustrates an example of a stack of layers for a plurality of electronic devices;

FIG. 3 illustrates an example of locations for interlayer conductive connects between conductor layers; and FIG. 4 illustrates an example of a technique for facilitating the electrical testing of conductors below the top conductor layer.

An example of a technique according to an embodiment of the present invention is described hereunder for the example of electronic devices comprising a transistor array of transistors designed to control an optical display media. However, the same technique is also applicable to other kinds of electronic devices, as well as devices comprising transistor array designs other than that illustrated in the drawings. Other examples of ways in which the devices illustrated in the drawings can be modified within the scope of the present invention, are discussed at the end of this description.

This example relates to the production of a plurality of electronic devices sharing a common sheet of support material 6 during part of the production process. The plurality of electronic devices are separated from each other at a later stage of the production process, and the area of each electronic device after separation is indicated by reference numeral 2. Each electronic array comprises a transistor array area designated by reference numeral 5, and a peripheral area used e.g. for routing gate and source conductors around the transistor array to one or more driver chip contacts. Reference numeral 4 designates the area over which continuous layers of conductor, semiconductor and insulator/dielectric materials are deposited on the sheet of support material during the production process. As illustrated, this deposition area 4 extends continuously all over and beyond a rectangular area whose perimeter coincides with the outer edges of the outer ones of the device areas 2*a*-2*i*.

Examples of support materials include flexible, plastic films having a planarised upper surface. Such flexible plastic films can be temporarily adhered to a rigid motherplate (not shown) during the production process.

With reference to FIG. 2, an example of a production process involves depositing a continuous first conductor layer 8 on the support sheet 6 and then patterning the first conductor layer to define an array of source and drain conductors for each of the electronic devices. In this example, the patterning of the first conductor layer also defines gate conductor extensions and temporary shorting bars, which are discussed in more detail below. The source conductors provide the source electrodes for the transistors, and the drain conductors provide the drain electrodes for respective transistors. According to one example, each source conductor provides the source electrodes for a respective row of transistors of a transistor array.

A continuous layer of organic semiconductor material 9, such as a semiconductor polymer, is then deposited over the patterned first conductor layer 8. This semiconductor layer 8 forms the semiconductor channels of all the transistors of all the transistor arrays.

A continuous layer of dielectric material (or a stack of continuous layers of dielectric materials) 10 are then deposited over the semiconductor layer 9. The dielectric layer(s) 10 forms the gate dielectric for all the transistors of all the transistor arrays.

In this example, the semiconductor and dielectric layers 9, 10 are then patterned to form through holes for interlayer conductive connects from gate conductor extensions defined by the first conductor layer 8 to respective gate conductors to be formed at the next stage of the production process. A continuous second layer of conductor material 12 is deposited over the dielectric layer(s) 10. This deposition of the second conductor layer fills the through holes formed in the semiconductor and dielectric layers 9, 10. The second conductor layer 12 is then patterned to define an array of gate conductors for each transistor array, which gate conductors provide the gate electrodes for the transistors. In this example, each gate conductor provides the gate electrodes for a respective column of transistors of a transistor array, and the gate conductors are connected through the through holes formed in the semiconductor and dielectric layers 9, 10 to respective gate conductor extensions defined by the patterned first conductor layer. In this example, the patterning of the second conductor layer 12 also defines (a) through holes in the gate conductors to accommodate interlayer conductive connects to be formed between the drain conductors and respective pixel conductors at a higher level; (b) temporary shorting bars to provide temporary connections between gate conductors as discussed in more detail below; and (c) through holes to accommodate interlayer conductive connects to be formed between an upper conductor layer 20 and temporary shorting bars 40 defined by the patterned first conductor layer 8.

A continuous layer of insulator material (or a stack of continuous layers of stack materials) 14 is then deposited over the patterned second conductor layer 12. This insulator layer(s) 14 functions to prevent electrical shorts between the second conductor layer 12 and the third conductor layer 16 mentioned below.

A continuous third layer of conductor material 16 is then deposited over the insulator 14, and is patterned to define through holes to accommodate (i) interlayer conductive connects between the drain conductors and respective pixel conductors defined by a higher conductor layer 20, (ii) interlayer conductive connects 28 between the gate conductor extensions and source conductors defined by the patterned first conductor layer to respective driver chip contacts defined by a higher conductor layer 20, and (iii) through holes to accommodate interlayer conductive interconnects between temporary shorting bars defined by the patterned first and second conductor layers and a higher conductor layer 20. This third conductor layer 16 functions as a screening layer that suppresses the effect of electric potentials at underlying conductors on the electric potentials at pixel conductors defined by the higher conductor layer 20.

A continuous layer of insulator material (or a stack of continuous layers of insulator material) 18 is then deposited over the patterned third conductor layer 16. This layer of insulator material 18 functions to prevent electrical shorts between the third conductor layer 16 and the higher conductor layer 20. The combination of semiconductor and insulator layers 9, 10, 14 and 18 are then patterned to define (i) through holes extending down to each drain conductor, (ii) through holes extending down to each gate conductor extension, (iii) through holes extending down to each source conductor; and (iv) through holes extending down to each temporary shorting bar defined by the patterned first and second conductor layers 8, 12.

A continuous fourth layer of conductor material 20 is then deposited over the insulator 18. This continuous fourth layer of conductor material 20 fills the through holes (i), (ii), (iii) and (iv) mentioned in the above paragraph. The fourth layer of conductor material 20 is then patterned to define at least (i) an array of pixel conductors each connected by one or more respective interlayer conductive interconnects (not shown) to a respective drain conductor, (ii) gate contacts connected by one or more interlayer conductive connects 28 to respective gate conductor extensions defined by the patterned first conductor layer 8; (iii) source contacts connected by one or more interlayer conductive connects 28 to respective source conductors defined by the patterned first conductor layer 8; and shorting bar contacts connected to respective shorting bars defined by the patterned first and second conductor layers 8, 12. The gate and source contacts defined by the patterned fourth conductor layer 20 are used to make connections to respective output terminals of one or more driver chips according to a chip-on-plastic (COP) technique or to one or more output terminals of one or more chip-on-flex (COP) packages; and as discussed below the shorting bar contacts are used for intermediate electrical testing of the source and gate conductors.

As mentioned above, in this example, the first patterned conductor layer defines an array of source conductors 32 each source conductor providing the source electrodes for a respective row of transistors. The patterning of the first conductor layer 8 includes defining one or more conductor shorting bars 34 that link respective groups of source conductors 32 within the patterned first conductor layer 8. These one or more temporary shorting bars 40 are located outwards of the locations of the interlayer conductive connections 28 between the source conductors 32 and the patterned fourth conductor layer 20. One or more extra interlayer conductive connects 36, 38 are formed from each shorting bar 40 to one or more upper levels. In this example, these extra interlayer connects include: (a) one or more interlayer connects 36 between each shorting bar 40 and one or more respective contacts defined by the patterned, second conductor layer 12, to facilitate testing at a stage after forming the gate conductors and before depositing the overlying insulator layer 14; (b) one or more interlayer connects 38 between each shorting bar 40 and one or more respective contacts defined by the patterned, further conductor layer 20, to facilitate testing after forming the pixel conductors and gate/source contacts etc. After electrical testing is completed, all conductor links between the shorting bars 40 and the source conductors 32 within the first conductor layer 8 are broken by creating troughs at one or more locations 40 between the shorting bars and the locations of the interlayer connects 28 between the source conductors 32 and the patterned fourth conductor layer 20. These troughs extend down through all layers of the stack down to the support substrate 6. Laser ablation is one example of a technique for forming these troughs. In this example, the second, third and fourth conductor layers are patterned such that these troughs can be formed without cutting through any conductor material of these three patterned conductor layers 12, 16, 20, in order to more reliably prevent undesirable electrical shorting between any of the four conductor layers. FIG. 4 only shows 7 source conductors, but the device may include more than a thousand source conductors, each providing the source electrodes for a respective one of more than a thousand rows of transistors. In this example, the technique of providing temporary shorting bars is similarly applied to the gate conductors. One or more interlayer interconnects are provided between each shorting bar defined by the patterned second conductor layer 12 and one or more respective contacts defined by the patterned further conductor layer 20.

After final electrical testing via the patterned fourth conductor layer 20 is completed and the temporary shorting bars 40 have been isolated, the resulting structure is later separated into individual devices by cutting through the layer stack and the support sheet 6. In this example, each individual device is thereafter laminated to a respective optical media component, in which respective pixel portions of an optical media 22 (e.g. electrophoretic media) are each independently switchable between two or more states by controlling the electric potential at the respective pixel conductor of the array of pixel conductors defined by the patterned fourth conductor layer 20.

In this example, the lamination process includes providing one or more compressible bond pads 26 between the optical media component and the control component at one or more areas outwards of the transistor array area 5 to create an electrical connection between one or more COM contacts defined by the patterned, fourth conductor layer 20 and a common electrode layer 24 of the optical media component.

The one or more bond pads 26 are forcibly compressed during the procedure of laminating the optical media component to the top of the stack in order to ensure a good, reliable conductive connection between the common electrode layer 24 of the optical media component and the one or more COM contacts defined by the patterned fourth conductor layer 20.

In this example, the interlayer conductive connects 28 for both the gate and source contacts defined by the patterned fourth conductor layer 20 extend down to source conductors and gate conductor extensions defined by the patterned first conductor layer 8; and interlayer conductive connects 30 between the gate conductors and the gate conductor extensions are formed at locations inwards of the bond pad locations (as schematically shown in FIG. 3). This technique of routing connections between the patterned fourth conductor layer 20 and parts of intermediate conductor layers located inwards of the bond pad locations via the patterned first conductor layer 20 is found to reduce the occurrence of device failures. This reduction in device failures is attributed to avoiding lateral routing through regions of the second, third and fourth patterned conductor layers that can be susceptible to deformation at the time of compressing the bond pads 26 between the optical media component and the top of the stack including the second, third and fourth conductor layers overlying one or more insulator/semiconductor layers comprising relatively soft, organic material. The production process may comprise additional process steps such as encapsulation etc.

The electronic devices may comprise one or more elements not illustrated in the drawings or mentioned above. For example, one or more additional functional layers may be provided, for example, between the plastic support film and the planarisation layer used to planarise the upper surface of the plastic support film, and/or between the planarisation layer and the first patterned conductor layer, and/or on the opposite side of the plastic support film to the planarisation layer.

In this example, the semiconductor layer 9 and all the dielectric/insulator layers 10, 14, 18 comprise organic polymer materials, and are deposited by liquid processing (such as flexographic printing and/or slit coating) or vapour deposition as continuous layers, i.e. without any masking to prevent deposition on any areas around the transistor array areas 5. The inventors for the present application have found that reducing the use of masks leads to less optical non-uniformities over the area of the transistor array when the array is used to control a display optical media.

In this example, the above-mentioned patterning of the organic layers is achieved by a laser ablation process.

In this example, all four conductor layers are deposited by sputtering, and patterned by photolithography. Examples of conductor materials for the conductor layers include metals and metal alloys. The conductor layers may have a multi-layer construction. For example, it has been found that using a bilayer metal construction for the conductor layers can improve adhesion between a conductor layer and the underlying organic material. For example, it has been found that forming each conductor layer by first depositing titanium (Ti) and then depositing a metal with a higher electrical conductivity (such as gold), can produce a layer which exhibits both better adhesion to the underlying organic material, and also good electrical conductivity. It has also been found that subjecting the organic layers to an argon plasma treatment immediately before deposition of overlying metal can improve the adhesion between the organic material and the overlying metal. It has also been found that subjecting the metal layers to an ultraviolet pre-treatment immediately prior to deposition of the overlying organic dielectric/insulating material can improve the adhesion of the metal layers to the respective overlying organic material.

The semiconductor layer 9 may be further patterned before deposition of the gate dielectric layer 10 in a way that reduces leakage currents between adjacent source conductors, particularly in the vicinity of the vertical interconnects 28 where the packing density of the source conductors can be greatest. Laser ablation is one example of a technique for performing such further patterning. Another example of techniques for reducing leakage currents (if necessary) include depositing a continuous layer of insulating material (e.g. insulating photoresist material) over the patterned first conductor layer before deposition of the semiconductor material 9, and patterning the insulating layer so as to retain the insulating layer under those areas of the semiconductor layer 9 for which leakage currents are a concern. Another example of an alternative technique is to permanently reduce the conductivity of the semiconductor material in those areas of the semiconductor layer 9 for which leakage currents are a concern. A further example of an alternative technique is to define in the patterned second conductor layer one or more additional conductors that overlie areas of the semiconductor layer in which leakage currents are a concern, and to apply to the additional conductors voltages that induce a reduction in the conductivity of the underlying semiconductor via a field-effect mechanism.

The above-described technique of reducing the use of masks for depositing the organic materials is also found to facilitate high resolution patterning of the conductor layers.

The description above relates to the example of an array of top-gate transistors. However, the above-described technique is equally applicable to the production of electronic devices other than transistor array devices, and also to the production of devices including other kinds of transistor arrays such as arrays of bottom-gate transistors. For example, the above-described technique is also applicable to other kinds of devices that comprise a stack of layers including one or more organic materials. One example of another kind of device not including a semiconductor layer is a direct drive cell device, in which each pixel conductor is directly connected to a respective output terminal of a controller, i.e. other than via a transistor. One example of another kind of device including a semiconductor layer is a sensor device such as a radiation sensor.

The above description relates to an example in which the gate and source conductors occupy different levels within the footprint of the TFT array, and either the source or gate conductors are routed around one corner of the TFT array to driver chip contacts. However, the above-described technique can also be used in combination with a technique in which the gate conductors or source conductors are routed to the driver chip contacts via locations between the other of the gate and source conductors at the same level as the other of the gate and source conductors within the footprint of the array.

The above description relates to an example of a device architecture in which the pixel conductors defined by the top conductor layer are connected to respective drain conductors defined by a lower conductor layer via through holes in the gate conductors, and a fourth, screening conductor layer is provided between the conductor layer defining the gate conductors and the conductor layer defining the pixel conductors. However, the above-described technique is also applicable, for example, to other architectures in which each drain conductor includes a landing pad which does not underlie any gate conductor and can be connected to the respective pixel conductor without requiring a through hole in a gate conductor; and/or no fourth, screening conductor layer is required.

In addition to the modifications explicitly mentioned above, it will be evident to a person skilled in the art that various other modifications of the described embodiment may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

The invention claimed is:

1. A method comprising:
forming on a common support one or more series of multi-layer electronic devices, and then separating said multi-layer electronic devices from each other; wherein the devices comprise one or more organic layers, and the method comprises depositing one or more of the organic layers as a respective continuous layer extending at least from one end of the one or more series of devices to an opposite end of the one or more series of devices; wherein the devices comprise at least three conductor layers at respective levels, and wherein the method further comprises creating one or more conductive connections between one or more parts of an upper conductor layer in a peripheral region and one or more parts of an intermediate conductor layer inwards of said peripheral region via one or more parts of a lower conductor layer extending between said peripheral region and said region inwards of said peripheral region.

2. The method according to claim 1, wherein the electronic devices each comprise an array of transistors, and wherein the one or more organic layers deposited as continuous layers comprise one or more of: a semiconductor layer defining the semiconductor channels of the transistors; a dielectric layer defining the gate dielectric of the transistors, and one or more insulator layers between conductor layers.

3. The method according to claim 1, wherein the electronic devices comprise at least one conductor layer defining an array of conductors to be driven via respective output terminals of one or more driver chips; and wherein the method comprises locating contacts for said one or more driver chips over said one or more organic layers deposited as continuous layers, which contacts are connected to respective ones of said conductors through said one or more organic layers deposited as continuous layers.

4. The method according to claim 1, wherein the method further comprises locating a bond pad in said peripheral region for a conductive connection between said upper conductor layer and an optical media component; and compressing said bond pad between optical media component and said upper conductor layer.

5. The method according to claim 1, wherein said upper conductor layer defines gate and source contacts for an array of transistors, and said one or more parts of said intermediate conductor comprise one or more gate conductors providing gate electrodes for said array of transistors and/or one or more source conductors providing source electrodes for said array of transistors.

6. The method according to claim 1, further comprising providing at least one shorting conductors linking a group of conductors within a conductor layer provided under one or more of said one or more organic layers deposited as continuous layers; providing at least one interlayer conductive connection between said shorting conductor through said one or more organic layers to a contact provided over said one or more organic layers deposited as continuous layers; performing electrical testing via said contact; and later isolating said shorting conductor from said group of conductors by removing one or more portions of said conductor layer and one or more portions of said one or more organic layers overlying said one or more portions of said conductor layer.

7. A method according to claim 2, wherein said one or more parts of said upper conductor layer in said peripheral region comprise gate contacts for said array of transistors, said one or more parts of said intermediate conductor layer inwards of said peripheral region comprise gate conductors providing gate electrodes for said array of transistors, and said one or more parts of said lower conductor layer extending between said peripheral region and said region inwards of said peripheral region comprise gate conductor extensions.

8. A method according to claim 1, wherein the at least three conductor layers and the one or more conductor extensions comprise a metal or metal alloy.

9. A method comprising forming on a common support one or more series of multi-layer electronic devices with areas between adjacent devices within a series, and then separating said multi-layer electronic devices from each other and said areas between adjacent devices within a series; wherein the devices comprise one or more organic layers, and the method comprises depositing one or more of the organic layers as a respective continuous layer extending at least from one end of the one or more series of devices to an opposite end of the one or more series of devices and covering said areas between adjacent devices within a series.

10. A method according to claim 9, wherein the electronic devices each comprise an array of transistors, and wherein the one or more organic layers deposited as continuous layers comprise one or more of: a dielectric layer defining the gate dielectric of the transistors, and one or more insulator layers between conductor layers.

* * * * *